United States Patent [19]
Tarrant

[11] Patent Number: 4,661,370
[45] Date of Patent: Apr. 28, 1987

[54] ELECTRIC DISCHARGE PROCESSING OF THIN FILMS

[75] Inventor: Dale E. Tarrant, Chatsworth, Calif.

[73] Assignee: Atlantic Richfield Company, Los Angeles, Calif.

[21] Appl. No.: 577,943

[22] Filed: Feb. 8, 1984

[51] Int. Cl.$^4$ .............................................. B05D 3/06
[52] U.S. Cl. ........................................ 427/37; 427/75
[58] Field of Search .................................. 427/37, 75

[56] References Cited
U.S. PATENT DOCUMENTS 3,296,011  1/1967  McBride et al. ................... 427/37
4,269,867  5/1981  Altorfer et al. ................... 427/37

Primary Examiner—Bernard D. Pianalto
Attorney, Agent, or Firm—Nilsson, Robbins, Dalgarn, Berliner, Carson & Wurst

[57] ABSTRACT

A deposited film is processed in a preselected pattern by discharging electric energy through the film across a gas dielectric. In a preferred embodiment, a voltage pulse chain is applied to a moving probe spaced a preselected distance from the film. The discharge either removes the film material over the pattern to expose underlying material, or produces a conductive path from the top to the bottom of the film.

18 Claims, 7 Drawing Figures

ELECTRIC DISCHARGE PROCESSING OF THIN FILMS

BACKGROUND OF THE INVENTION

The present invention relates to the field of solid state electronics and, more particularly, to a method of electric discharge processing of thin films.

In the semiconductor field, it is often desirable to selectively remove or otherwise process thin films in well defined patterns. Selective removal of films in the manufacture of thin film monolithic solar cells is described in: Hanak "Monolithic Solar Cell Panel of Amorphous Silicon", *Solar Energy* 23:145-147 (1979); Borden U.S. Pat. No. 4,278,473; Tyan et al. U.S. Pat. No. 4,315,096; and Morel et al. U.S. patent application Ser. No. 495,198, filed May 16, 1983. These works relate to specific monolithic constructions wherein thin film layers are patterned to produce a number of individual cells connected electrically together. The films making up the cells are patterned by a variety of techniques, including mechanical scribing, laser scribing and wet chemistry (photoresist) techniques.

None of the prior patterning techniques has proven both reliable and cost effective in production. Mechanical scribing is a relatively crude process in which a hard scribing tool contacts a film surface. The tool removes a wide path of material and tends to wear rapidly when relatively hard films, such as tin oxide (TO), are scribed. Laser scribing produces a thin, well-defined line in two dimensions, but is difficult to control depthwise. Thus, it is difficult to selectively remove one layer of a thin film structure without penetrating the other layers. Laser scribing also requires a large capital investment. Such scribers typically have a single scribing beam and are not well suited to high volume production. The wet chemical approach to patterning thin films is probably the least desirable method in solar cell manufacture. It is costly and time-consuming to perform, due to the number of steps required, and can contaminate a cell structure.

Other methods have been proposed to interconnect active portions of monolithic solar cells. According to one such method, a number of relatively tall contact grid lines are positioned beneath a photoactive layer to electrically connect the front of one cell to the back of an adjacent cell. Another method involves the application of heat with a laser to crystallize or dope a well defined path through a photoactive layer. Both methods are described in Morel et al. U.S. patent application Ser. No. 495,198, filed May 16, 1983. However, the former method tends to reduce the active area of the module, and the laser method suffers from the limitations discussed above. The laser method is also cumbersome because the module must be moved relative to the laser.

Therefore, it is desirable in many applications to provide a method for selectively processing thin films in well-defined patterns without the use of wet chemistry or a laser source.

SUMMARY OF THE INVENTION

The present invention relates to a method of processing a thin film in a preselected pattern, comprising the steps of: providing a gaseous environment at a preselected location on the film; and discharging electric energy through the gaseous environment and the film at that location. In a preferred embodiment, the discharge step comprises positioning a probe a preselected distance from the film and applying an electric potential to the probe. The potential may be applied as a pulse chain, whereupon the probe is moved as the chain is applied. The discharge may remove the material of the film over the preselected pattern, as by vaporization, or may otherwise process the material. In the case of a semiconductive film, the discharge may produce a conductive path through the film either by fusing layers together or by crystallizing or doping the film materials. The gaseous environment may be provided by directing a gas jet toward the probe and/or drawing gas from the region of the probe.

The method of the present invention permits thin films to be processed in a highly controllable manner by producing a simple electric discharge over a preselected pattern. The method is most commonly used as a substitute for chemical or laser patterning of the film. Heat associated with the discharge then selectively vaporizes the film in the desired pattern.

Electric discharge takes place through a dielectric gaseous medium provided by a jet directed toward the discharge. The jet cools the probe tip, carries away the products of vaporization, and removes gas ions produced by the discharge. If ions are not removed in this manner, they can cause the discharge to wander from the desired path by providing random, low-resistance paths for it to follow.

Another use of the present method is to provide localized conductive paths through amorphous or microcrystalline semiconductor films, such as the photovoltaic layer of a monolithic solar cell. For example, a semiconductive layer can be heated to its crystallization temperature by the discharge. Crystallization can occur in the presence of a dopant or other material combinable with the semiconductor to enhance conductivity even further. Alternatively, the heat may simply fuse or weld the layers of the film together. Because the photovoltaic layers of monolithic modules are typically very thin, the desired conductive path can be provided by a modest increase in conductivity.

The discharge method of the present invention is more easily controlled than mechanical scribing. It can be performed with a movable head consisting of an electrical probe and a gas nozzle. The head can then be moved across large workpieces by a mechanism similar to a conventional X-Y plotter. A number of discharge heads can be ganged together to process a film in parallel-lined patterns. Each head is then connected to a power source by an electrically conductive lead, and to a source of dielectric gas by a flexible hose. Whereas a laser operates along only one line at a time, the present method can produce a number of lines simultaneously.

BRIEF DESCRIPTION OF THE DRAWINGS

The above and other features of the present invention may be more fully understood from the following detailed description, taken together with the accompanying drawings, wherein similar reference characters refer to similar elements throughout and in which.

DESCRIPTION OF THE PREFERRED EMBODIMENT

Figure 1:
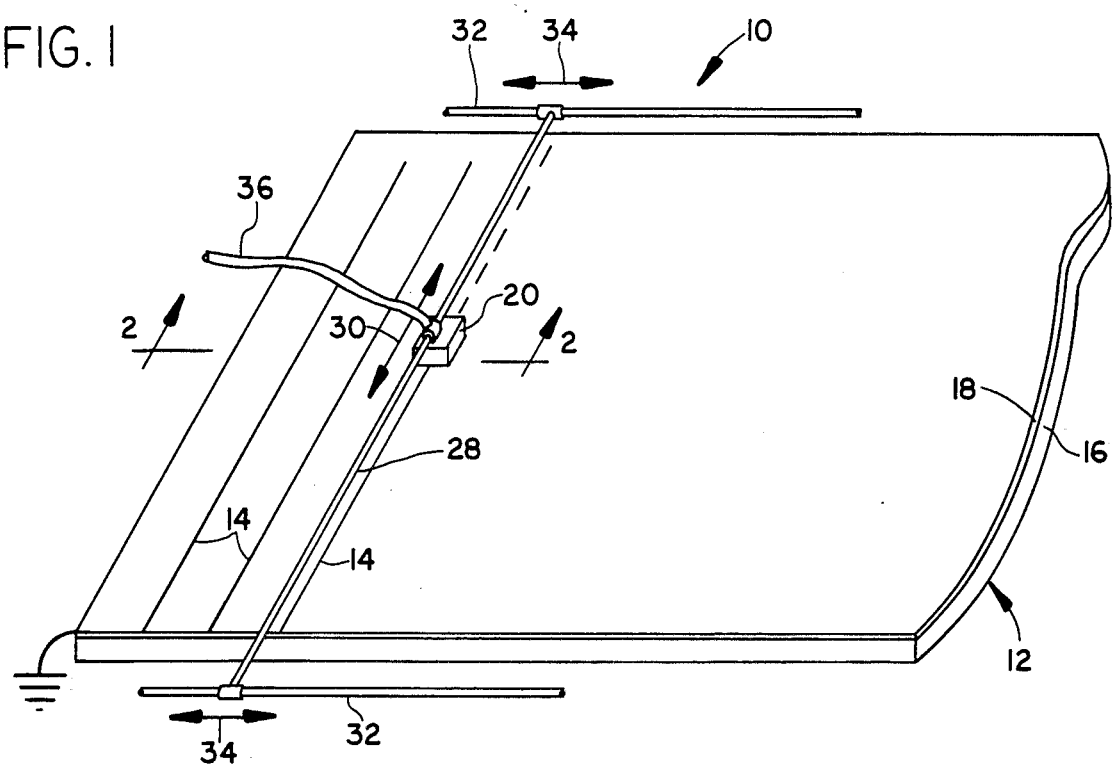
FIG. 1 is a perspective view of an electric discharge device constructed according to one embodiment of the present invention, being used to process a thin film.
Figure 2:
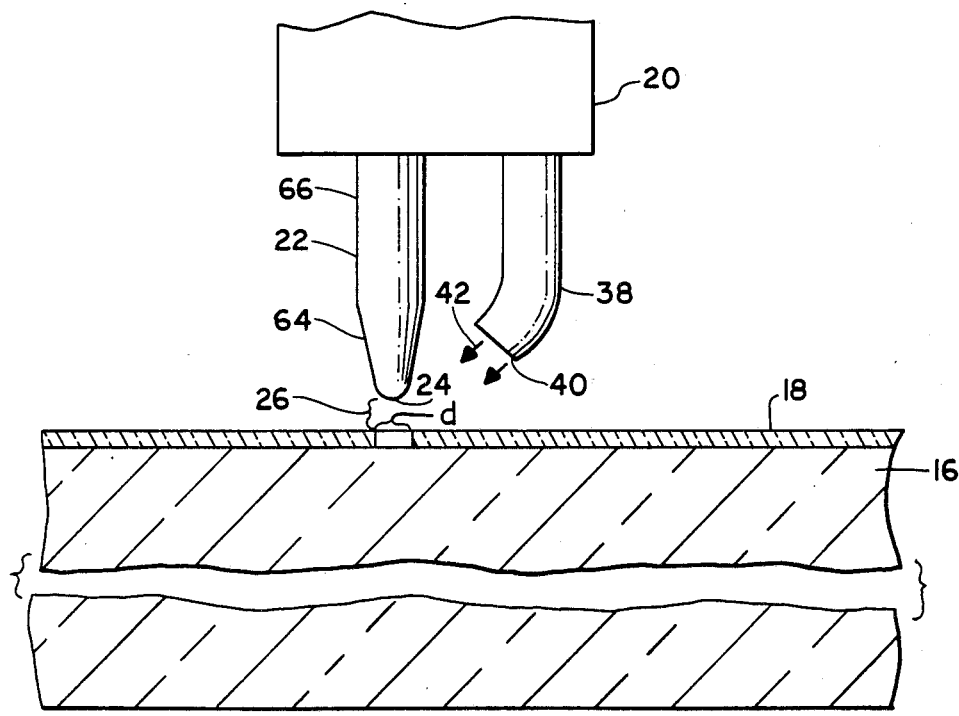
FIG. 2 is a vertical sectional view taken along the line 2—2 of FIG. 1, showing certain details of the device and the film being processed.

Referring now to FIGS. 1 and 2, a proposed electric discharge apparatus 10 is positioned over a workpiece 12 for processing the workpiece along a plurality of lines 14. The workpiece preferably comprises a substrate 16 having at least one thin film 18 on the upper surface thereof. A probe head 20 of the discharge apparatus traverses the workpiece to form the lines 14.

As seen most clearly in FIG. 2, the probe head 20 has a downwardly extending conductive probe 22 with a tip 24 spaced a preselected distance 26 from the film. The probe head applies an electric signal sufficient to produce a discharge between the probe and the film, and heat from the discharge processes the film. The signal is preferably a voltage pulse chain applied to the probe as it moves across the film. When the film is semiconductive it may be crystallized or doped in the heating process to yield regions of increased conductivity, or component layers of the film may be fused together. Otherwise, the discharge vaporizes the film, cutting a path which separates one region of the film from another. It is this process, denoted "electric discharge scribing", with which the present invention is primarily concerned. However, similar considerations apply to the crystallization, doping and fusing modes of operation. The primary differences between the modes of operation are due to the level of voltage applied and to the interaction of the spark with the components of the film. The apparatus 10 may also be used to process a thin film structure having a plurality of different layers. In that case, the magnitude and frequency of the pulses can be controlled to selectively process specific layers of the structure.

Referring again to FIG. 1, the probe head 20 is mounted for movement over the surface of the film 18 to process the film in a desired pattern. The probe head is mounted upon a support rail 28 for movement in a lateral direction 30, and the support rail 28 is mounted at opposite ends to a pair of side rails 32 for movement in a longitudinal direction 34. Thus, the probe head traverses the support rail 28 to form the lines 14, and is moved from one of the lines 14 to another by movement of the support rail along the side rails. This positioning mechanism is similar in concept to an X-Y plotter of the type used to record analytical information. The rails 28 and 32 may be constructed in the manner of such plotters, which are well known in the art. As the probe head is moved, it is supplied with an electric signal and any other required input along a flexible line 36.

As shown in FIG. 2, the probe head preferably includes a gas nozzle 38 which terminates in an orifice 40 directed toward the probe. Gas conducted along the flexible line 36 is emitted from the nozzle as a jet 42 to provide a dielectric gaseous medium between the probe tip and the film. The gas jet also carries away the products of vaporization, prevents corrosion of the probe tip, and carries away ions produced by the discharge.

Figure 3:
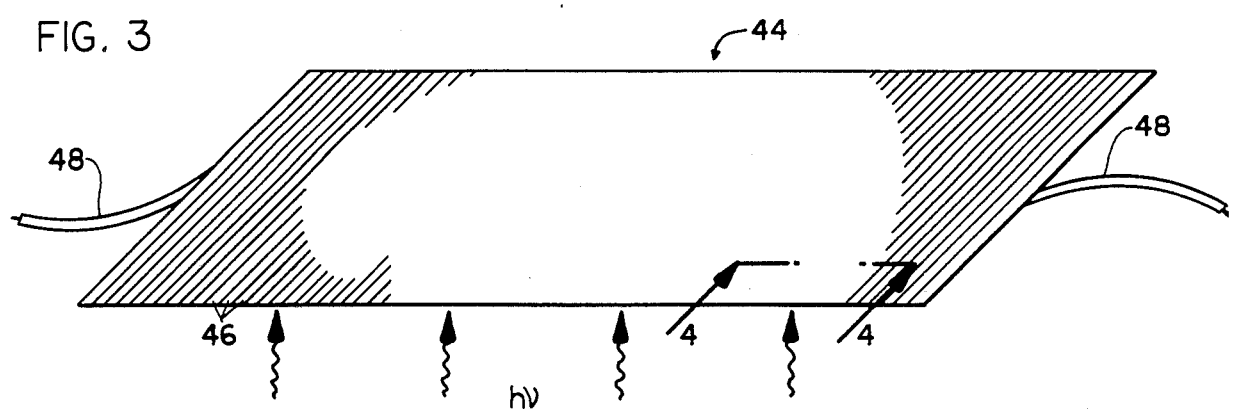
FIG. 3 is a perspective view of a monolithic solar module having at least one film processed according to the present invention.

The method of the present invention is particularly useful in the manufacture of thin film solar modules of the type designated 44 in FIG. 3. The module 44 comprises a plurality of individual p-i-n cells 46 arranged as parallel strips extending laterally across the module. The cells are connected in series with each other along their longitudinal edges and are connectable to an external circuit by a pair of leads 48. When light (h$\gamma$) is incident on the underside of the module 44, the photovoltaic effect produces a voltage at the leads 48. Current generated by the cells travels a very short distance within each cell electrode before passing to the opposite electrode of an adjacent cell. In this way, series resistance losses due to the cell electrodes are minimized.

Figure 4:
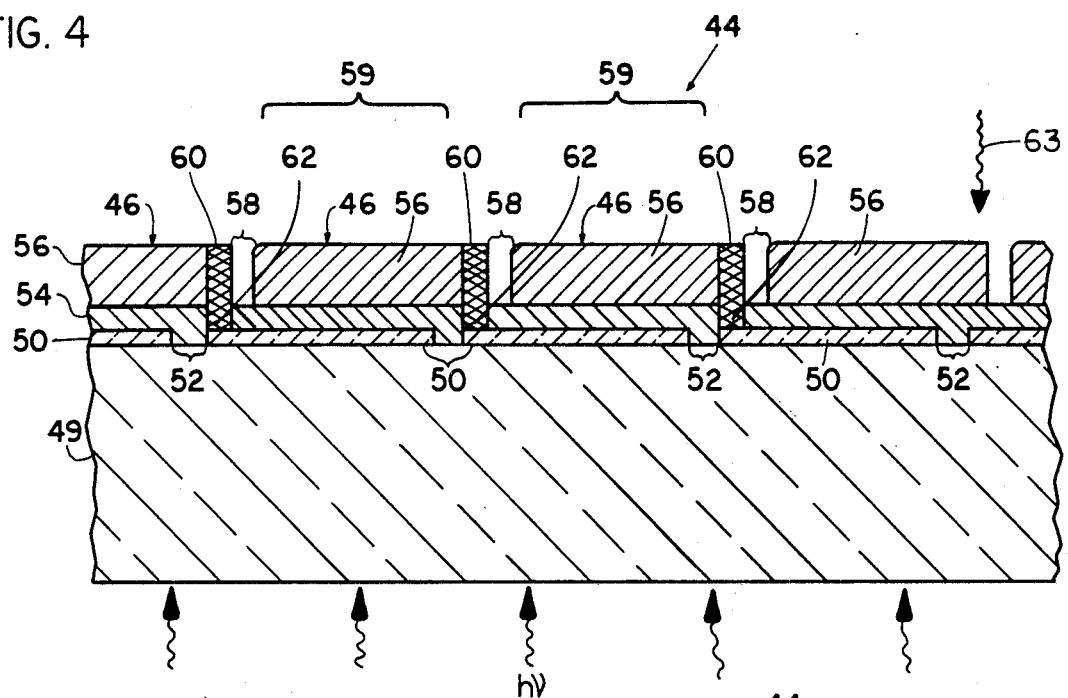
FIG. 4 is a fragmentary vertical sectional view taken along line 4—4 of FIG. 3.
Figure 5:
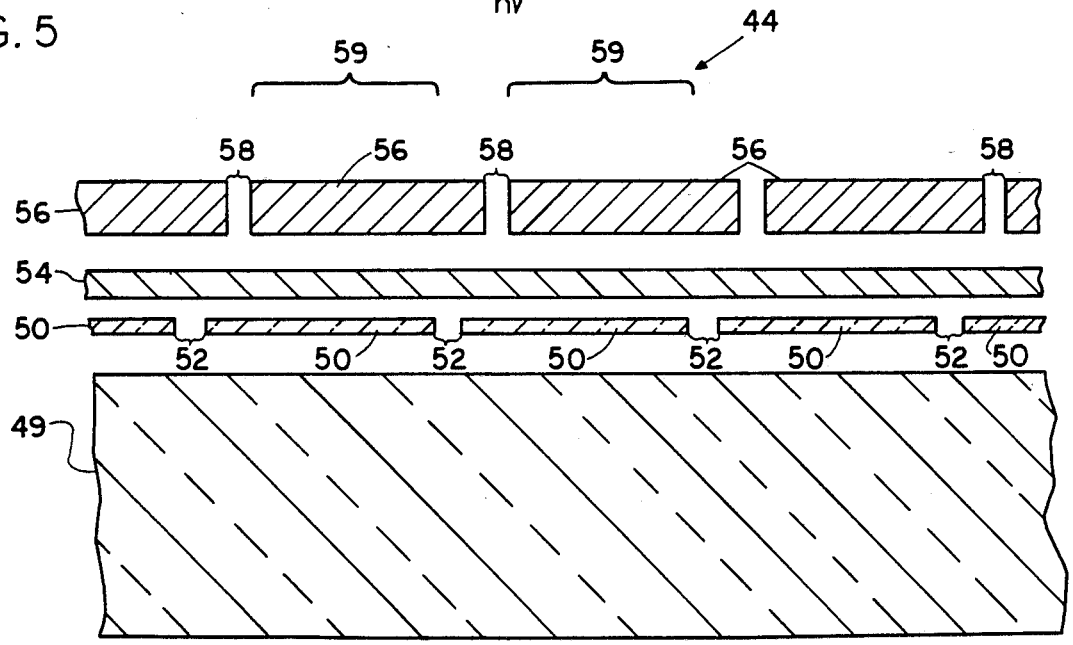
FIG. 5 is a diagrammatic exploded sectional view corresponding to the structure of FIG. 4.

The structure of the module 44 is shown in greater detail in FIGS. 4 and 5, wherein the cells 46 are deposited as thin film photovoltaic devices on a transparent superstrate 49. A plurality of transparent conductive regions 50 are applied to the upper surface of the superstrate 49 for use as front contact electrodes. The front electrodes 50 are separated from each other by gaps 52. A photovoltaic layer 54 is applied over the front electrodes, followed by back contact electrodes 56. The back electrodes are separated by gaps 58 which are staggered relative to the gaps 52 of the front electrodes 50, such that the front and back electrodes of each cell are generally coextensive with a photovoltaic region 59 of the layer 54, and the back electrode of each cell overlaps the front electrode of an adjacent cell along its longitudinal edge. A conductive region 60 is preferably provided through the electrode 56 and the photovoltaic layer 54 at the location of electrode overlap to interconnect the cells. The conductive regions 60 are formed either by crystallizing a portion 62 of the photovoltaic layer at the location of electrode overlap or by causing a dopant or other material to diffuse into the photovoltaic layer at that location. In either case, the portion 62 is made conductive by heat produced in the discharge 63 (FIG. 5). Alternatively, the back contact 56 may be directly fused to the front electrode 50 of an adjacent cell by the localized heating produced by the spark.

Referring to FIG. 5, the front electrodes 50 and the back electrodes 56 may be formed as continuous films and later separated into discrete electrodes according to the process of the invention. Thus, electrical energy is discharged along lines corresponding to the gaps 52 and 58 to separate the films into elongated contact portions. During this process, the probe 22 is moved in a direction perpendicular to the plane of the drawing figures. However, in scribing the back contact layer it may be difficult to control the discharge sufficiently to avoid disturbing the photovoltaic layer 54. This problem does not exist in the case of the front contact layer because the superstrate 49 is relatively unaffected by the discharge.

It will be understood that the detailed structure of the solar module 44 is described herein merely as an example of a module with which the process of the present invention is useful. In fact, the process is applicable to a wide range of monolithic solar cells and other semiconductor devices.

The module 44 may be made of any conventional materials according to known processes. For example, the layers may take the form described in co-pending U.S. patent application Ser. No. 495,198, filed May 16, 1983, which is commonly owned herewith. That disclosure is hereby incorporated by reference. Thus, the superstrate 49 may be glass or other suitable transparent material which is compatible with the front electrodes 50 and the photovoltaic layer 54. The front electrode layer is preferably a transparent conductive oxide, such as indium tin oxide (ITO), tin oxide (TO) or indium oxide (IO). A combination of these materials is also possible. The photovoltaic layer 54 is preferably a microcrystalline thin film (MTF) silicon layer having $n^+$, i and $p^+$ layers defining a photojunction for conversion of light to electrical energy. The back electrodes 56 may be discrete metallic contacts made by screen printing, shadow masking or other conventional process, or may be vacuum deposited as a continuous film and later "scribed" according to the method of the invention. The various layers can be of any suitable thickness within the ranges disclosed in the cited copending application.

Focusing now on the proposed method of scribing the film 18 (FIGS. 1 and 2), specifically in the context of a transparent conductive film of the type used for the front electrodes 50 of the module 44, voltage pulses are applied to the probe to discharge electrical energy across the gap 26 between the probe tip 24 and the film 18. The discharge occurs through a gaseous medium to vaporize or otherwise process the film. Processing is accomplished by heat associated with the discharge; i.e., the thermal vibrational energy of electrons and other charged particles associated with the discharge and resistive heating losses in the film.

The voltage of thermal processing must be high enough to break down the dielectric gaseous medium between the probe tip and the film. The dielectric medium may be air or a suitable "inert" gas, preferably with oxygen removed to inhibit corrosion of the probe tip or reaction with the film. However, in some circumstances it may be desirable to include a reactive gas in the dielectric atmosphere to more directly control the chemistry occurring during discharge. Etching rates can be enhanced with a corrosive atmosphere or deposition can be caused to occur along defined pathways with an atmosphere containing an organometallic gas. A suitable reactive atmosphere might also react with debris produced by vaporizing action.

The choice of a gas depends largely upon its ionization energy and mobility, and often involves a trade-off between these parameters. Helium, for example, is difficult to ionize and has a high mobility in the gas phase. Its mobility would tend to cause the spark to wander from the prescribed line. Argon, on the other hand, is easier to ionize and is much less mobile than helium, and may be a better choice for the present purposes. Published values for the breakdown voltages (dielectric strengths) of air and argon, measured at 60 hertz, are 330 and 200 RMS volts/mil, respectively.

The breakdown voltage of the dielectric gap is also a function of the spacing between the probe tip and the nearest point on the film. Although the spacing is preferably comparable to the width of the material being removed, it can vary widely from that value. As a lower limit, the probe tip can be positioned immediately above an insulating substrate, or even in contact with it. If the tip is to be operated below the film surface, a cavity is formed in the film by a first pulse. The probe is then lowered into the cavity and moved along the film as further pulses are applied. After each pulse, the probe moves in the desired direction. This causes the shortest distance to the conductive film material, and therefore the highest electric field, to be in that direction. Each successive discharge pulse is then properly directed. If the probe is in contact with the insulating substrate, the spark would follow its surface in the direction of the closest film material. The upper limit on probe spacing is the point at which the distance to uncut film material along the desired path is just enough less than the distance to either side of the cut to cause the spark to follow the path. In the case of a cut 1.0 mil (25.4 microns) wide and a rounded probe tip 1.0 mil (25.4 microns) wide, the probe tip should be no more than approximately 2.0 mils (50.8 microns) above the film.

Another factor in determining the breakdown voltage is the shape of the probe tip. It defines a potential profile around the probe and affects the point at which the dielectric will break down. A pointed probe concentrates the electric field and minimizes the breakdown voltage. A low breakdown voltage is desirable to minimize the energy dumped in one pulse. However, a pointed probe tends to wear down in use. In accordance with the teachings of the present invention, a preferred probe would have a tip which is sharply rounded to a radius of curvature between approximately 0.25 and 0.5 times the width of the cut. The probe would preferably have a cone-shaped transition, as shown at 64 in FIG. 2, narrowing down to the prescribed tip size from a cylindrical shank 66. The transition 64 enhances heat transfer for cooling of the tip 24. The probe 22 is preferably made of a noncorrosive, high melting point material, such as tungsten.

The width or "cut" of material removed from the film 18 is designated "d" in FIG. 2, and will typically be between approximately 0.5 mils (12.7 microns) and 5.0 mils (102.0 microns) wide. The preferred cut width is believed to be approximately 1.0 mil (25.4 microns). A width less than 0.5 mil would tend to cause technical difficulties, and a width of more than approximately 5.0 mils would be wasteful of cell area.

The potential between the probe 22 and the film 18 is preferably applied as a pulse chain, each pulse having a sharp rise time and a short duration. This permits thermal energy to be dumped locally into the film before enough material has been removed to cause the spark to wander beyond the edge of the desired area. The pulses may be sinusoidal, although there may be a preference for a specific polarity. If the polarity changes, the film is bombarded alternately with ions and electrons, possibly making the process more difficult to control. Although the thin film 18 of FIG. 1 is shown as being grounded, the method can be practiced by applying a positive potential to the film and grounding the probe. This causes the film to be bombarded primarily with electrons, and minimizes sputtering of the film material. The peak voltage of the pulses will typically be no greater than approximately six kilovolts (6 KV), but in any event will be at least equal to the breakdown voltage of the dielectric gap.

The upper limit of the velocity at which the probe is moved (v) is a function of the diameter of the cut (d) and the frequency of the pulse chain (f), according to the relation:

$$v = d\, f$$

Thus, the speed must be no greater than that at which the probe travels between succeeding pulses a distance approximately equal to the diameter of the material removed by one pulse. This assures that the film is continuously scribed or otherwise processed along the desired pattern. The lower limit of probe speed is simply that at which the probe progresses sufficiently in the direction to be cut that, at the time of each pulse, the electric field between the probe and the next area to be removed is greater than the field between the probe and any other area of the film. This guarantees breakdown in the desired direction. As a practical matter, the distance between the probe and the next area to be removed must be appreciably less than the distance to the film at the sides of the cut path. For a cut diameter (d) of 1.0 mil (25.4 microns) and a frequency of 10 kilohertz, the maximum probe speed would be approximately 10 inches (25.4 centimeters) per second. The lower limit would be approximately 2.5 inches (6.35 cm) per second, based on movement of the probe one-fourth of the cut diameter between pulses.

Figure 7:
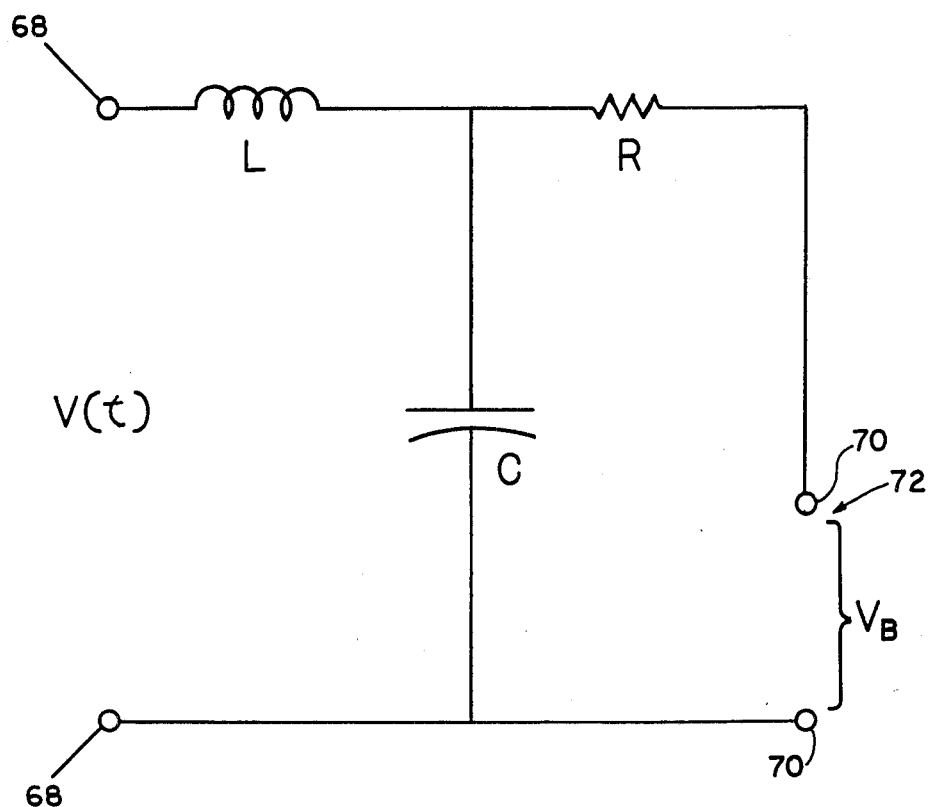
FIG. 7 is a generalized schematic diagram of the output circuit of a power supply for producing voltage pulses useful in the method of the present invention.

FIG. 7 schematically illustrates the output circuit of a power supply useful for applying voltage pulses to the probe 22 and film 18. An input voltage (V(t)) is applied to a pair of input leads 68, and the probe and film are connected to respective output leads 70. A capacitance (C) is charged by the input voltage through an inductance (L), and discharges across a resistance (R) and a gap 72 each time it reaches a preselected breakdown voltage ($V_B$). The gap 72 corresponds to the gap 26 between the probe tip 24 and the film 18. The charging frequency is determined by L, $V_B$, V(t) and C. The power and duration of the discharge is determined by the values of C, R and $V_B$. In this regard, it will be appreciated that the parameters L, R and C are "lumped parameters" which describe the output characteristics of the power supply but not its detailed structure. The indicated circuit elements may be replaced by solid state components having effective circuit parameters of the required magnitudes.

Figure 6:
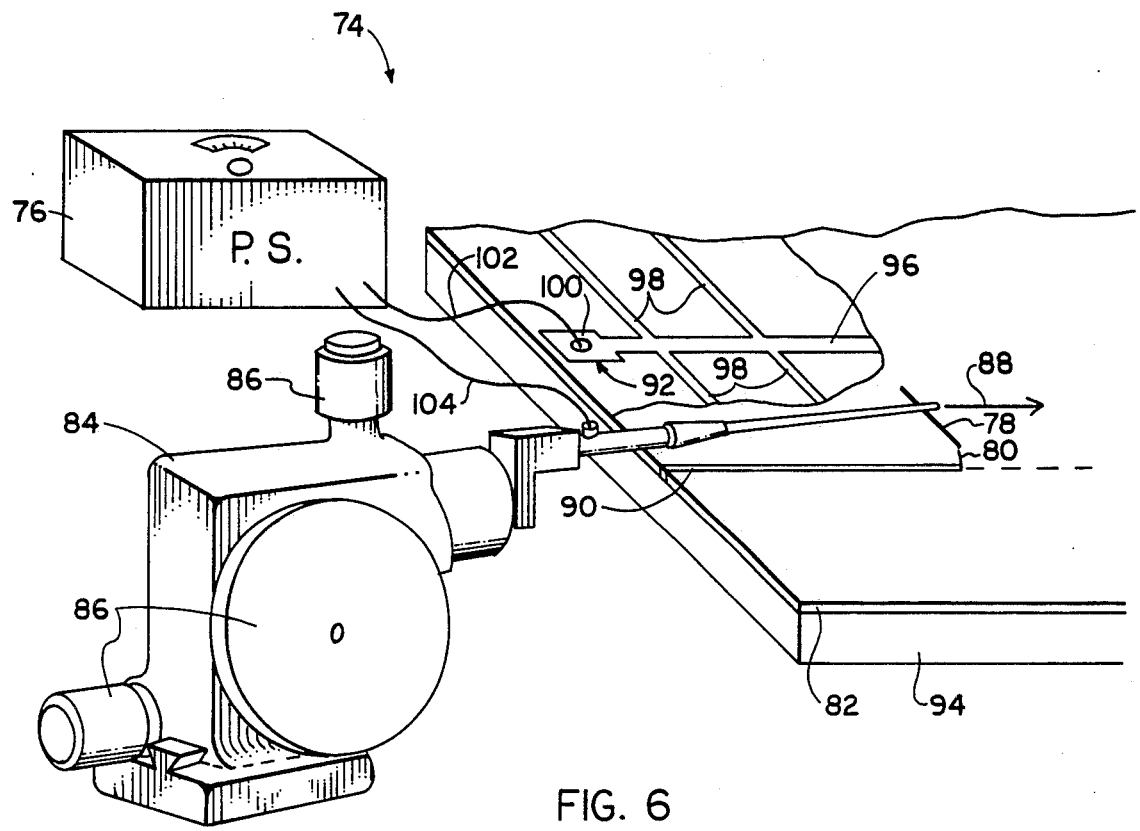
FIG. 6 is a schematic perspective view of an experimental apparatus through which the theory of the present invention has been verified.

The apparatus of FIGS. 1 and 2 is disclosed as an apparatus by which the method of the present invention might be practiced in a production environment. However, FIG. 6 illustrates an experimental apparatus 74 by which the principles of the invention have actually been demonstrated. In the apparatus 74, a high frequency power supply 76 applies a sinusoidal waveform to a probe 78, producing a discharge 80 onto a transparent conductive film 82. The probe 78 was held in place by a microprobe positioner 84 having knobs 86 for controlling probe position in three orthogonal directions. The probe 78 was moved relative to the film in a direction 88 to remove the material of the film along a path 90.

Electrical connection between the power supply 76 and the conductive film 82 was provided through a test grid 92, which was screen printed on a glass substrate 94 prior to applying the film 82. The substrate was a four-inch by four-inch (10-centimeter by 10-centimeter) sheet of Corning 7059 glass, and the test grid had a central backbone 96 with nine ribs 98 extending in opposite directions therefrom. The ribs 98 were spaced at intervals of one centimeter on center, and the backbone had a contact pad 100 at either end. The power supply was connected to the contact pad 100 by a negative lead 102, and to the probe positioner 84 by a positive lead 104. The test grid served to conduct current from the film 82, completing the circuit to the power supply.

The films 82 used in the experiment were tin oxide (TO) films deposited by chemical vapor deposition to thicknesses of between approximately 500 and 2500 angstroms. The experiment was performed at frequencies ranging between approximately 10 and 100 kilohertz, and the power was not monitored. The discharge produced with the experimental apparatus removed the TO very well. However, the spark tended to wander to either side of the position where TO was first removed. It is believed that this was due in part to the creation of ions which allowed longer spark paths in the nature of a Jacob's ladder, and in part to the coarse power control and the inability to move the substrate to a new location before each pulse. Of these considerations, it is believed that the primary limitation was the inability to move the probe at a constant speed.

The experiment was conducted first in air, and then with freon blowing across the substrate to remove ions produced by the discharge. The results were similar in the two cases, presumably due to the inability to control probe movement. The experiment was tried with the substrate 94 positioned on an X-Y table during discharge; however, the electrical noise produced by the discharge disrupted the table controller and caused erratic movement.

The power supply 76 used in the practice of the present invention was a broad band amplifier (8 KHz–111 KHz) manufactured by Electronic Navigation Industries of Rochester, N.Y., as Model No. EGR-800. The power supply has a rated output of 800 watts. The microprobe positioner 84 used in the experiment was manufactured by Alessi Industries, Inc., of Costa Mesa, Calif. as "Model AM-100 Linear/Dovetail Microprobe." It is designed for use with tips as small as 4 microns in diameter.

The same experiment was repeated with a Tesla coil manufactured by Electro Technic Products of Chicago, Ill. as Model BD 10. The Tesla coil is a hand-held high frequency generator of conventional design which is operated at 120 volts and has a maximum rated output of 0.35 amps. Its metallic output probe was spaced above a TO sample film identical to that used in conjunction with the apparatus 74. The output of the coil produced a high frequency discharge onto the grounded film, scribing the TO in the desired manner. However the spark tended to wander in the same manner as with the apparatus 74, and for essentially the same reason. The experiment with the Tesla coil was conducted both in air and in the presence of flowing freon, yielding similar results.

Experiments were also conducted with the two experimental apparatuses on a sample identical to that described above but having an aluminum film applied over the TO film. The aluminum film was vacuum deposited to a thickness of approximately 2000 angstroms, and was similar in makeup to the back electrodes 56 of the module 44 (FIG. 4). Both apparatuses scribed the aluminum along with the TO.

From the above, it can be seen that there has been provided a method for processing a thin film with an electric discharge consisting of a pulse train at a controlled distance and velocity relative to the film.

While certain specific embodiments of the invention have been disclosed as typical, the invention is of course not limited to these particular forms but rather is applicable broadly to all such variations as fall in the scope of the appended claims. As an example, the probe may remove the thin film, as by vaporization, or may subject it to localized heating to alter its conductivity or composition. Heat from the discharge can crystallize a semiconductive material or cause a dopant or additional constituent to be taken up by the material. The film also need not be conductive and the substrate need not be insulating. For example, it is believed possible to remove dielectric materials from conductive surfaces, such as the stainless steel substrates of many solar cells. The dielectric standoff of the insulating layer is then added to the standoff of any gap between the probe and the layer to define the breakdown voltage.

What is claimed is:

1. A method of selectively processing an existing inorganic film in a preselected pattern, comprising the steps of:
   providing a gaseous environment at a preselected location on the film;
   positioning electric probe means a preselected distance from the film at said location;
   applying an electric potential to the probe means to discharge electric energy through the gaseous environment as a spark from the probe means to the film at said location; and
   causing relative movement between the probe means and the film along said pattern.

2. The method of claim 1 wherein:
   the probe means is moved at a constant rate relative to the film to define said pattern.

3. The method of claim 1 wherein:
   said film includes at least two component layers; and
   the discharge produces said conductive path by fusing the component layers together over said pattern.

4. The method of claim 1 wherein: the film is conductive.

5. The method of claim 4 wherein:
   the film is deposited on an insulating substrate prior to said processing.

6. The method of claim 5 wherein:
   the film is grounded.

7. The method of claim 1 wherein:
   the discharge removes the material of the film over said pattern.

8. The method of claim 7 wherein:
   the material of the film is vaporized over said pattern.

9. The method of claim 1 wherein:
   said film includes a semiconductive material; and
   the discharge produces a conductive path through the thickness of the film over said pattern.

10. The method of claim 9 wherein:
    the gaseous environment is provided by directing a gas jet substantially toward the probe means.

11. The method of claim 10 wherein:
    the material of the film is vaporized over said pattern; and
    the products of vaporization are carried away from the preselected location by the gas jet.

12. The method of claim 10 wherein:
    the gaseous environment is substantially inert.

13. The method of claim 10 wherein:
    the gaseous environment consists essentially of argon.

14. In the manufacture of a photovoltaic device, a method of selectively processing an existing inorganic film in a preselected pattern, comprising the steps of:
    providing a substantially inert gaseous environment at a first preselected location on the film;
    positioning electric probe means a preselected distance from the film at said first location;
    discharging electric energy through the gaseous environment as a spark from the probe means to the film at said location by applying a voltage pulse to the probe means;
    moving the probe means relative to the film along said pattern; and
    applying additional pulses to the probe means as the probe means is moved.

15. The method of claim 14 wherein:
    each pulse is sufficient to remove the material of the film at a different preselected location on said pattern.

16. The method of claim 15 wherein:
    the material of the film is substantially vaporized over said pattern.

17. The method of claim 14 wherein:
    said at least one film includes a semiconductive material; and
    the voltage pulses produce a conductive path through the thickness of the film over said pattern.

18. The method of claim 17 wherein:
    the voltage pulses produce said conductive path by crystallizing the semiconductive material over said pattern.

* * * * *